United States Patent

[11] 3,631,464

[72] Inventor Roger C. Dahlberg
Palo Alto, Calif.
[21] Appl. No. 809,355
[22] Filed Mar. 21, 1969
[45] Patented Dec. 28, 1971
[73] Assignee Singer-General Precision, Inc.
Binghampton, N.Y.

[54] DIGITAL PARALLEL TO SERIAL CONVERTER

5 Claims, 11 Drawing Figs.

[52] U.S. Cl. .......... 340/347 DD
[51] Int. Cl. .......... G06f 5/04
[50] Field of Search .......... 340/347, 172.5; 178/26, 53.1; 179/18 TR; 235/155, 154

[56] References Cited

UNITED STATES PATENTS

| | | | |
|---|---|---|---|
| 3,166,637 | 1/1965 | Oleson .......... | 340/347 X |
| 3,261,913 | 7/1966 | Riechert .......... | 178/26 |
| 2,920,820 | 1/1960 | Goldberg et al. .......... | 340/347 X |
| 2,968,693 | 1/1961 | Gaffney et al. .......... | 235/154 X |
| 3,247,491 | 4/1966 | DuVall .......... | 340/172.5 |

*Primary Examiner*—Maynard R. Wilbur
*Assistant Examiner*—Charles D. Miller
*Attorneys*—Francis L. Masselle and William Grobman

ABSTRACT: The disclosed embodiment of the present invention is a digital parallel to serial converter for a television raster display which employs a phase-locked loop for controlling the conversion rate. The disclosed converter is formed of a register which receives data in parallel form, a plurality of transfer gates for transferring data out of the register, and a frequency controlled gating circuit for enabling the transfer gates. The frequency controlled gating circuit is formed of a voltage controlled oscillator having an output connected to a counter, which is, in turn, connected to a decoder from which the gating pulses are derived for enabling the transfer gates. A flip-flop is connected to the counter and to a clock, such that the DC average value of an output thereof forms a feedback control for the oscillator.

Patented Dec. 28, 1971 3,631,464

5 Sheets-Sheet 1

INVENTOR.
ROGER C. DAHLBERG

BY

INVENTOR.
ROGER C. DAHLBERG

BY

Andrew M. Pullar

INVENTOR.
ROGER C. DAHLBERG
BY

Patented Dec. 28, 1971

3,631,464

5 Sheets-Sheet 4

INVENTOR.
ROGER C. DAHLBERG
BY

Andrew M. Pullen

Patented Dec. 28, 1971

3,631,464

5 Sheets-Sheet 5

INVENTOR.
ROGER C. DAHLBERG

BY

Andrew J. Dallos

DIGITAL PARALLEL TO SERIAL CONVERTER

This invention relates generally to a digital parallel to serial converter and more particularly to a circuit arrangement which converts digital words of a number of binary bits to a continuous stream of serial binary bits regardless of a variation of the sequential rate of the incoming words.

One of the primary problems encountered in digital parallel to serial converters is that of timing the transfer of a number of bits appearing simultaneously on an equal number of lines into a serial stream of bits on a single line. In conjunction with this problem, digital parallel to serial converters known in the past have the problem of providing a continuous stream of information without any discontinuities therein. These difficulties arise from the fact that the sequential rate of the incoming words varies over a small range, which variation is primarily due to a change in the speed of the storage media from which the incoming words are retrieved.

Because of these problems of prior known parallel to serial converters, various disadvantages are evident in specific applications of such converters. An example of such a specific application is the conversion of parallel-serial binary data recorded on a rotating magnetic memory to a serial stream of binary bits for display on a television raster. A video signal for the television raster display is formed of the serial stream of bits which must remain continuous regardless of any variation in the speed of the rotating memory, since any discontinuity in the video signal will appear as a repetitive pattern in the display.

The above-mentioned problems and disadvantages of the prior art are overcome by the present invention which is generally formed of a register which receives data in parallel form, a plurality of transfer gates for transferring data out of the register into a serial stream, and a frequency control gating circuit for enabling the transfer gates. The frequency control gating circuit is generally formed of a frequency controllable oscillator which is disposed for enabling the transfer gates, and means responsive to the frequency of the oscillator and to the frequency of a clock associated with the storage of the data in parallel form, which means provides a control signal for the oscillator.

Accordingly, it is an object of the present invention to provide a digital parallel to serial converter which is capable of supplying a continuous stream of serial binary bits regardless of a small variation of the sequential rate of the incoming word.

Another object of the present invention is to provide a parallel to serial converter which is capable of providing a television raster display of digital video information.

Still another object of the present invention is to provide a parallel to serial converter which employs a phase locked loop to allow variable word spacing at an input thereof while providing a continuous serial stream of bits at an output thereof.

A feature of the present invention resides in the provision of a phase-locked loop which is responsive to an output of a reference oscillator and is further responsive to clock pulses derived from the storage which contains the digital words in parallel form to control the output frequency of the oscillator.

Another feature of the present invention resides in the provision of a voltage-controlled oscillator in the phase-locked loop which employs emitter coupled integrated circuit logic elements.

These and other objects, features and advantages of the present invention will be more fully realized and understood from the following detailed description, wherein.

Like reference numerals throughout the various views of the drawings are intended to designate the same or similar structures.

Figure 1:
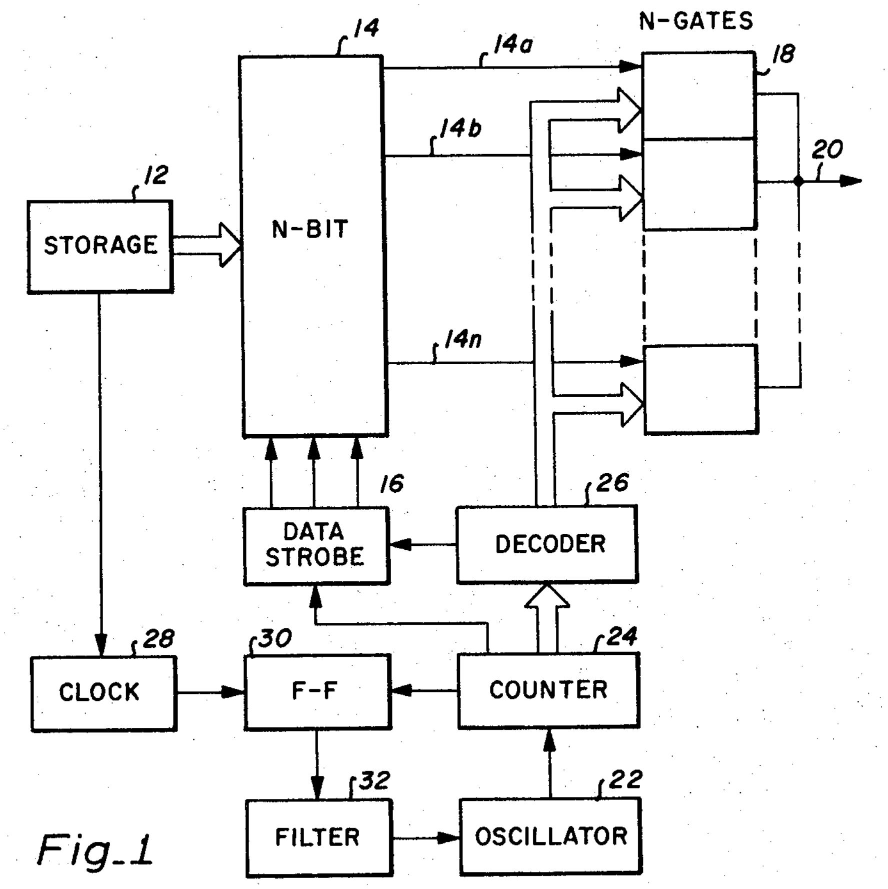
FIG. 1 is a block diagram of a digital parallel to serial converter constructed in accordance with the principles of the present invention.

With reference to FIG. 1, there is shown a digital parallel to serial converter constructed in accordance with the principles of the present invention. As shown therein, a storage unit 12, which is a magnetic drum or the like, continuously supplies digital words in parallel form to an N-bit register 14. A data strobe circuit 16 enables the register 14 to receive the digital data from the storage 12. Once the information is received in the register 14, it is available on output lines **14*a*, 14*b–n* for being transferred into a serial stream of information. A plurality of transfer gates 18 have respective inputs thereof connected to the output lines 14*a*, 14*b–n*. By enabling the individual transfer gates 18 in succession, the information contained on lines 14*a*, 14*b–n* is made available on an output line 20 in a serial stream. It can be readily appreciated that the timing of the enabling or gating pulses to the transfer gates 18 is of critical importance if it is desired to provide a continuous stream of serial binary bits on the output line 20. As previously mentioned, the sequential rate of the incoming words from the storage 12 may vary slightly resulting in a discontinuity in the stream of serial binary bits available at the output of the transfer gates 18**.

The present invention overcomes this problem by the provision of a phase-locked loop in the circuit which supplies the enabling or gating pulses to the transfer gates 18. In particular, a voltage controlled oscillator 22 is connected to a counter 24, which counter effectively divides the output of the oscillator 22 by a predetermined factor. An output of the counter 24 is connected to a decoder 26 which supplies gating pulses to the individual transfer gates 18. Another output of the counter is also employed for triggering the data strobe circuit 16.

One of the storage tracks in the storage unit 12 contains timing information which is supplied to a clock circuit 28. The timing information is synchronized with the transmission of information from the storage unit 12 to the register 14. The clock 28 generates a series of clock pulses in response to the timing information from the storage unit 12.

A flip-flop 30 is responsive to an output from the counter 24 and the timing pulses generated by the clock 28. The output waveform of the flip-flop 30 is a square wave whose DC average value is proportional to the phase error between the incoming timing pulses and the positive going edges of the last counter stage in the counter 24. The square wave output of the flip-flop 30 is filtered by a filter circuit 32 which produces a DC error voltage which is supplied to the oscillator 22 to control the frequency thereof.

Figure 2:
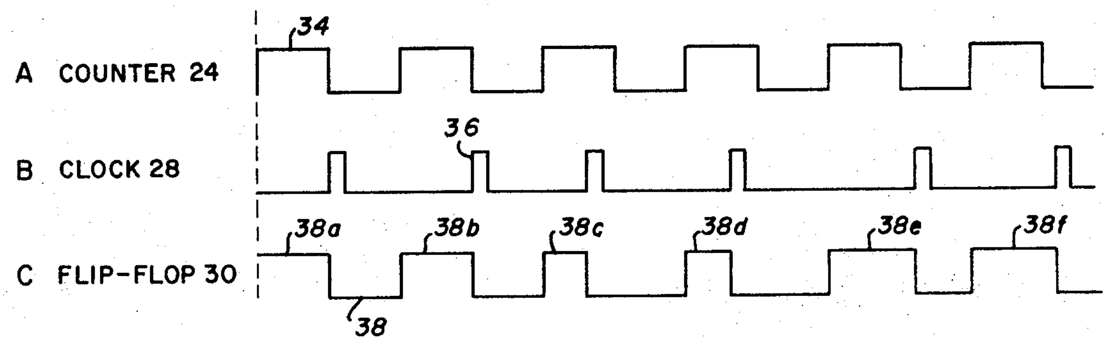
FIG. 2 illustrates several important waveforms useful in understanding the principles of the present invention.

The waveforms illustrated in FIG. 2 are useful in understanding the operation of the phase locked loop including the oscillator 22, the counter 24, the clock 28, the flip-flop 30, and the filter 32. As shown therein, the counter 24 supplies a signal to the flip-flop 30 having a form represented by the waveform 34. The clock 28 supplies timing pulses to the flip-flop 30 having a form represented by the waveform 36. The output of the flip-flop 30 is a square wave having the form represented by the waveform 38, which has a DC average value proportional to the phase error between the incoming timing pulse from the clock 28 and the positive going edges of the signal form the counter 24. As shown in FIG. 2, every positive transition of the waveform 34 will "RESET" the flip-flop 30 and every pulse from the clock 28 will "set" the flip-flop 30. The first tow positive pulses 38*a* and 38*b* of the waveform 38 demonstrate the pulse width which is obtained during the condition when the oscillator 22 is providing the desired frequency output. The positive pulses 38*c* and 38*d* of the waveform 38 demonstrate the pulse width which is obtained during a condition of the output frequency of the oscillator 22 being less than desired. The positive pulses 38*e* and 38*f* of the waveform 38 demonstrate the pulse width which is obtained during conditions when the output frequency of the oscillator 22 is greater than that desired.

Figure 3:
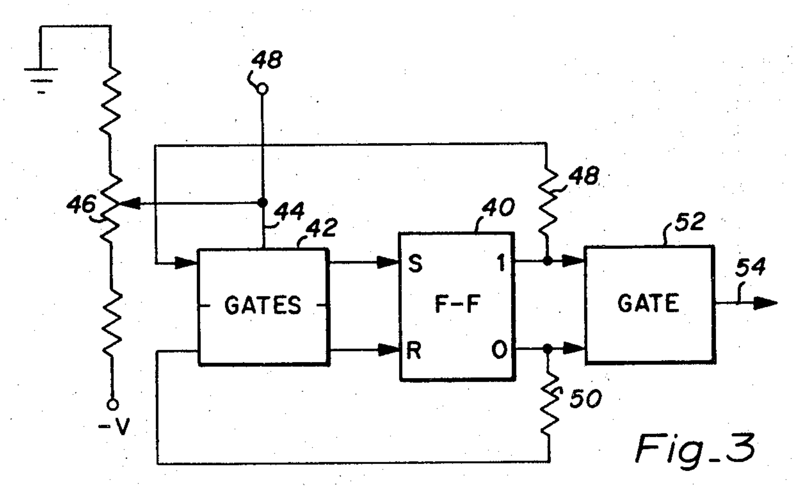
FIG. 3 is a partial block and partial schematic diagram of the oscillator circuit illustrated in FIG. 1.

FIG. 3 illustrates in partial block and partial schematic diagram the oscillator 22 illustrated in FIG. 1. The oscillator 22 is basically an astable multivibrator formed of a flip-flop 40 and two logical inverting (NOR) gates 42. The switching threshold, and thus the delay time, of the gates 42 is controlled by the voltage supplied at an input 44. The voltage at the input 44 is partially developed by a voltage divider network including a potentiometer 46 having the variable contact arm thereof connected to the input 44. A voltage which is proportional to the DC average value of the signal at the output of the flip-flop 30 is developed by the filter 32 and supplied to a terminal 48 which is connected to the input 44. One of the gates 42 has an output connected to the "SET" input of the flip-flop 44 and has an input connected through a resistor 48 to the "1" output of the flip-flop 40. The other of the gates 42 has an output connected to the "RESET" input of the flip-flop 40 and has an input thereof connected through a resistor 50 to the "0" output of the flip-flop 40. A gate 52 transfers the output of the flip-flop 40 to an output line 54.

The gates 42 are formed of emitter coupled integrated circuit logic elements which are of the nonsaturating type. The oscillator 22 provides a linear function output with the use of digital elements.

Figure 4:
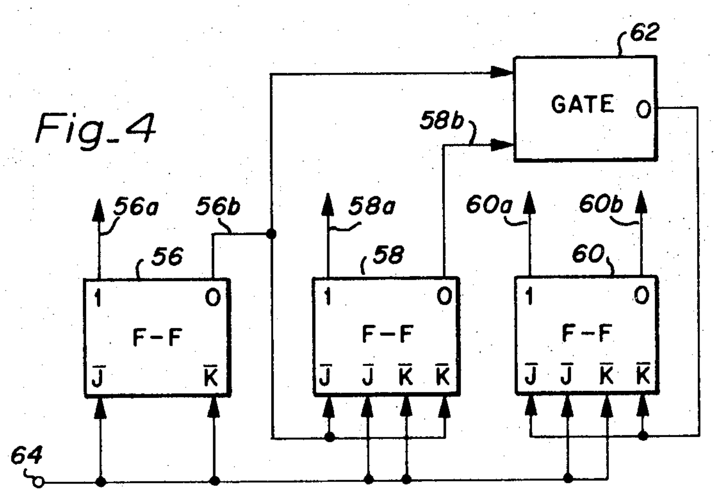
FIG. 4 is a block diagram of the counter illustrated in FIG. 1.

The counter circuit 24 is illustrated in FIG. 4 in block diagram form and includes three flip-flops 56, 58, and 60 and a gate 62. Two inputs of each of the flip-flops 56, 58 and 60 are connected to a terminal 64 which is connected to an output of the oscillator 22. Outputs 56*a*, 58*a*, and 60*a* of the flip-flops are supplied to the decoder 26. An output 56*b* of the flip-flop 56 is connected to one input of the gate 62 and to inputs of the flip-flop 58. The flip-flops 56, 58 and 60 are of the buffered JK type, such that when a "0" level appears at the output 56*b*, the flip-flop 58 is conditioned to change its state upon the occurrence of a pulse at the terminal 64. An output 58*b* of the flip-flop 58 is connected to the other input of the gate 62, such that when a "0" level appears at the two inputs of the gate 62, a "0" at the output thereof conditions the flip-flop 60 to alter its state upon the occurrence of a clock pulse at the terminal 64. An output 60*b* of the flip-flop 60 is supplied to an input of the data strobe circuit 16 and to an input of the flip-flop 30.

Figure 5:
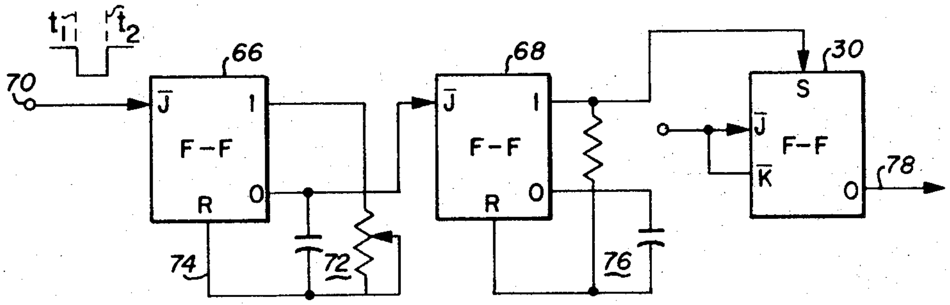
FIG. 5 is a partial block and partial schematic diagram of the clock and flip-flop circuits illustrated in FIG. 1.

The clock 28 and flip-flop 30 are illustrated in greater detail in FIG. 5. As shown therein, the clock 28 includes a pair of flip-flops 66 and 68 which are of the buffered JK type. A timing signal from the drum memory is supplied to an input of the clock at a terminal 70 which is connected to one input of the flip-flop 66. The flip-flop 66 is conditioned upon the occurrence of a negative going edge and is triggered upon the subsequent occurrence of a positive going edge. An RC time constant circuit 72 is connected at an output of the flip-flop 66 and provides a time delay reset pulse at a reset input 74. An appropriate output from the flip-flop 66 conditions and triggers the flip-flop 68 to provide an output pulse to the "SET" input of the flip-flop 30. An RC time constant circuit 76 is connected between an output of the flip-flop 68 and the "RESET" input thereof to control the pulse width of the signal supplied to the flip-flop 30. The JK inputs of the flip-flop 30 are connected to the output 60*b* of the counter 24 (see FIG. 4). An output of the flip-flop 30 is provided on a line 78 to the filter circuit 32.

Figure 6:
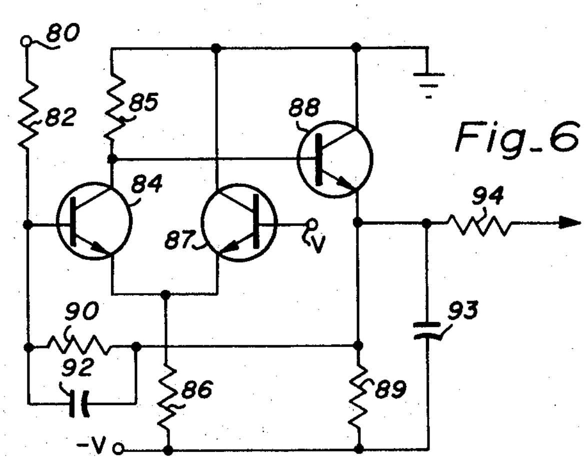
FIG. 6 is a schematic diagram of the filter circuit illustrated in FIG. 1.

The filter circuit 32 is illustrated in FIG. 6. An output of the flip-flop 30 supplied on the line 78 is connected to an input of the filter 32 at a terminal 80. The filter 32 is essentially formed of an operational amplifier which is provided with capacitive feedback to perform an integration. In particular, the input terminal 80 is connected through a resistor 82 to the base of a transistor 84. The collector of a transistor 84 is connected to ground by means of a resistor 85 and the emitter thereof is connected to negative voltage by means of a resistor 86. A transistor 87 is connected between ground potential and the emitter of the transistor 84. A voltage V is connected to the base of the transistor 87.

The collector of the transistor 84 is connected to the base of a transistor 88 having the collector thereof connected to ground potential. The emitter of the transistor 88 is connected through a resistor 89 to a source of negative voltage. In addition, the emitter of the transistor 88 is connected through a resistor 90 and a capacitor 92 in parallel to the base of the transistor 84. A capacitor 93 is connected between the emitter of the transistor 88 and the source of negative potential. An output from the filter 32 is provided through a resistor 94. In operation, the square wave signal supplied at the terminal 80 develops a DC signal at the output of the filter 32 which is proportional to the average value of the square wave input signal.

Figure 7:
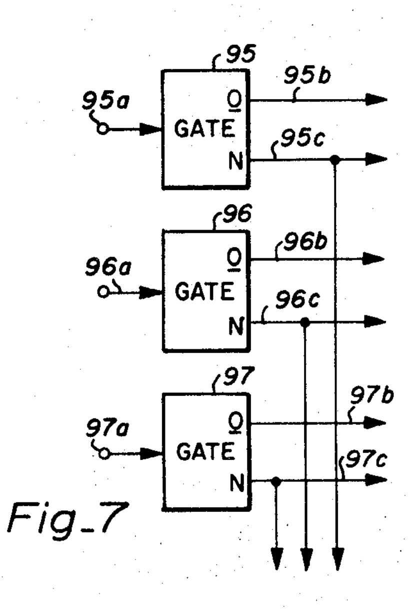
FIG. 7 is a block diagram of the decoder illustrated in FIG. 1.

The decoder circuit 26 is illustrated in FIG. 7 and includes a plurality of gates 95, 96 and 97. Respective outputs 56*a*, 58*a*, and 60*a* of the counter illustrated in FIG. 4 are connected to respective input terminals 95*a*, 96*a* and 97*a*, respectively. The outputs appearing on the lines 95*b*, 96*b* and 97*b* are of the same polarity as the input signal to the respective gates, while the outputs 95*c*, 96*c* and 97*c* are of opposite polarity to the signal supplied at the inputs of the respective gates. As a result, the signals appearing on the outputs of the gates 95, 96 and 97 provide a three-bit digital word which is employed for enabling the transfer gates 18.

Figures 8, 9:
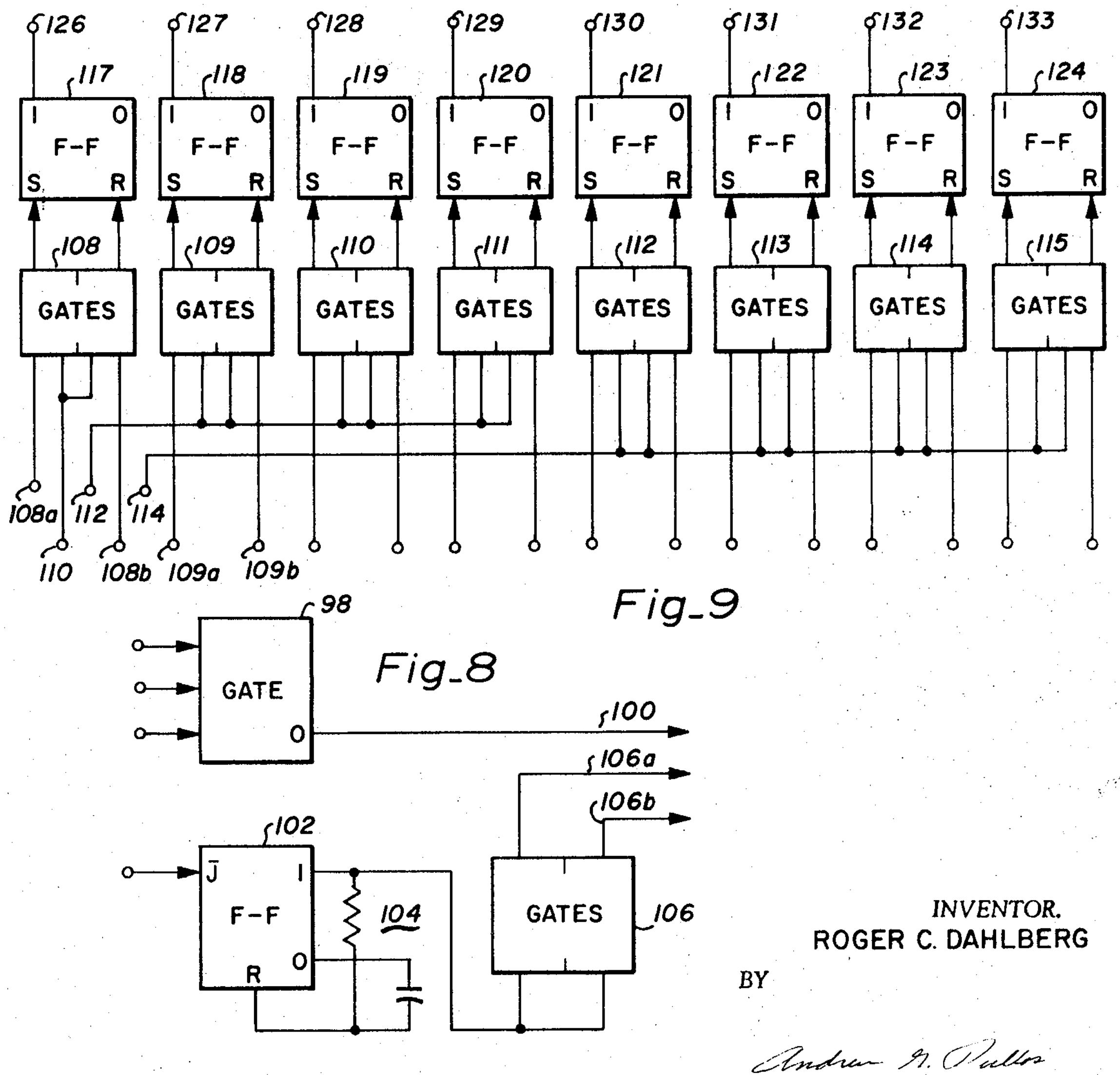
FIG. 8 is a partial block and partial schematic diagram of the data strobe circuit illustrated in FIG. 1.
FIG. 9 is a block diagram of the register illustrated in FIG. 1.

The data strobe circuit 16 is illustrated in FIG. 8. A gate 98 is provided with three inputs which are connected to output lines 95*c*, 96*c* and 97*c* of the decoder illustrated in FIG. 7. Only when each of the inputs to the gate 98 is a "0," will the output on the line 100 be a "0." The data strobe circuit 16 also includes a flip-flop 102 having an input connected to the output line 60*b* of the counter illustrated in FIG. 4. An RC time constant circuit 104 is connected between an output of the flip-flop 102 and a "RESET" input thereto to control the pulse width at the output. The output of the flip-flop 102 is connected through a pair of gates 106 which perform an inversion of the signal and supply an output on lines 106*a* and 106*b*.

The register 14 is illustrated in greater detail in FIG. 9. A plurality of pairs of gates 108–115 are disposed for receiving a respective bit of information at their respective *a* input terminal and the compliment of a respective bit at their *b* input terminal. The gate 108 is enabled by a pulse applied to a terminal 110 which is connected to output line 100 in FIG. 8. Gates 109, 110 and 111 are enabled by a pulse applied to a terminal 112 which is connected to output line 106*a* in FIG. 8. In addition, gates 112, 113, 114 and 115 are enabled by a pulse supplied to a terminal 114 which is connected to output line 106*b* in FIG. 8.

The digital word impressed on the input terminals of the gates 108–115 is transferred to a plurality of flip-flops 117–124 upon the occurrence of an enabling pulse at the input of a respective one of the gates 108–115. As soon as the information is entered into the flip-flops 117–124, it is available at output terminals 126–133 thereof.

Figure 10:
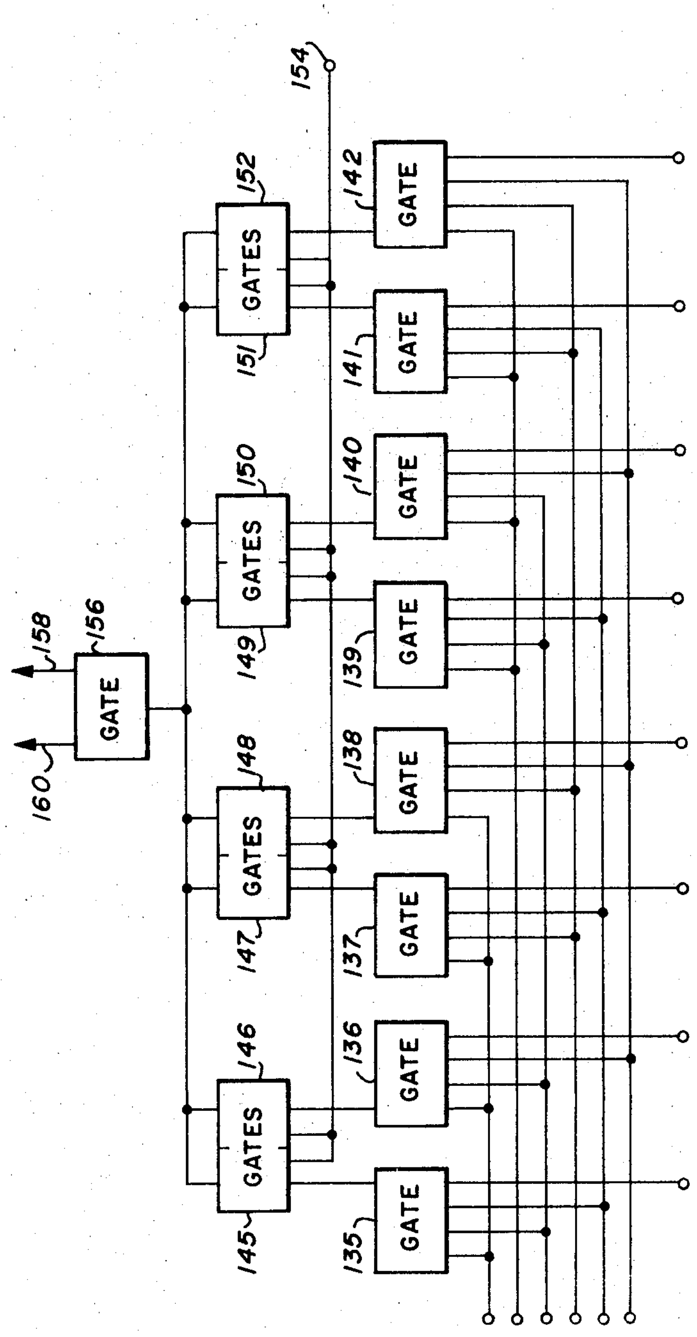
FIG. 10 is a block diagram of the transfer gates illustrated in FIG. 1.

The transfer gates 18 are illustrated in greater detail in FIG. 10. As shown therein, a plurality of gates 135–142 are each provided with four inputs, three of which are connected to respective outputs of the decoder 26, the fourth of which is connected to a respective one of the output terminals 126–133 of the register 14. The outputs of each of the gates 135–142 are transferred through a respective one of gates 145–152 upon the occurrence of an enabling signal at a terminal 154. The outputs of the gates 145–152 are connected together and to an input of a gate 156 which provides a true and a compliment of the information on output lines 158 and 160, respectively.

Figure 11:
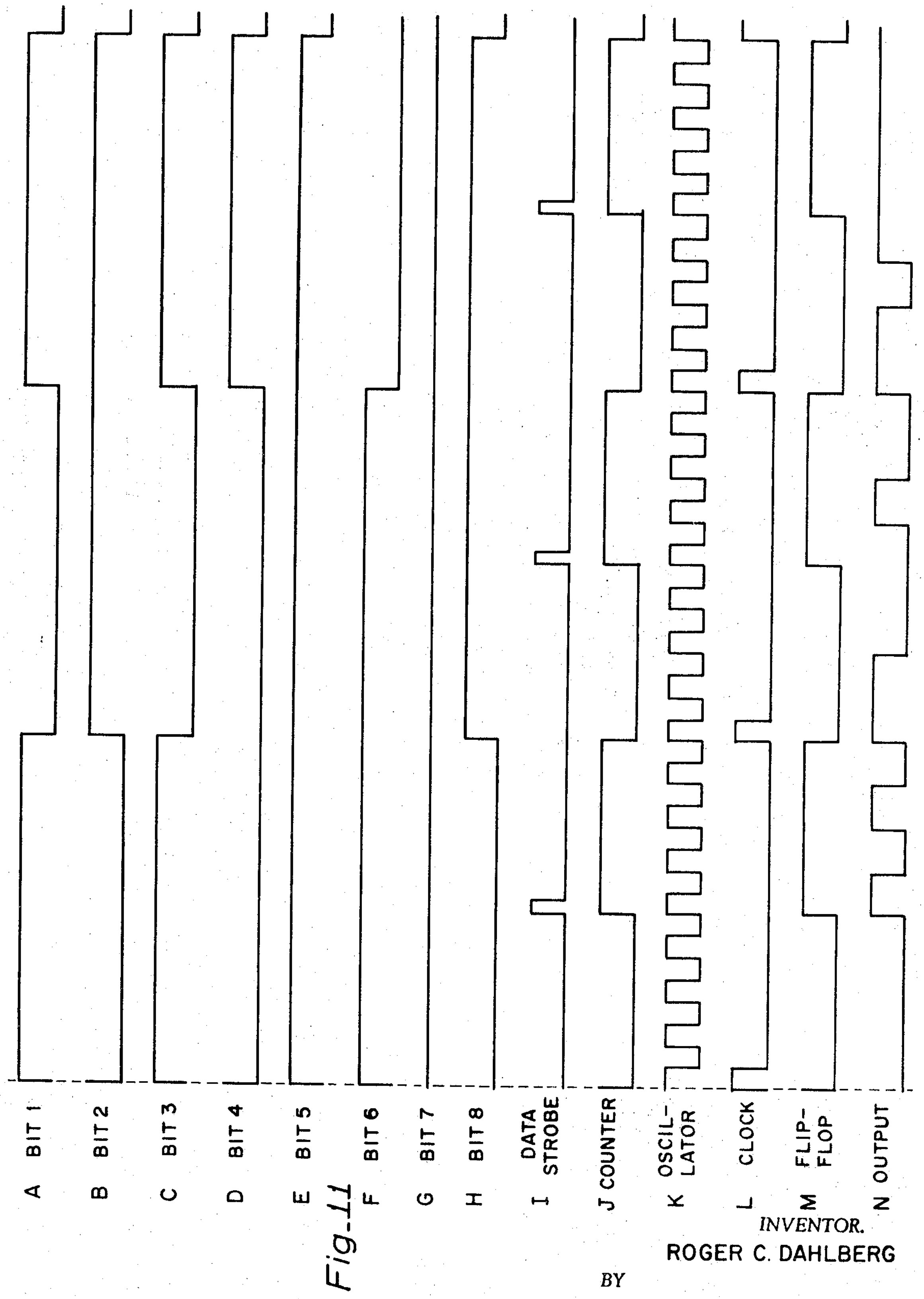
FIG. 11 illustrates a number of waveforms useful in understanding the transfer of digital words in the form of parallel binary bits into a continuous stream of serial binary bits.

The operation of the binary parallel to serial converter of the present invention can be better understood with reference to FIG. 11 which contains an illustration of several waveforms appearing throughout the circuitry. FIG. 11A–H represent typical bits of information which are retrieved from the storage unit 12 supplied to the register 14. Accordingly, the first word of information supplied to the register 14 would consist of the binary bits 10101100. The waveform of the output of the data strobe circuit 16 is illustrated in FIG. 11I and occurs during the first count in a count cycle of the counter 24. This output appears on the lines 106*a* and 106*b* in FIG. 8. Because of the specific connection of the gate 98 to the output of the decoder 26, an output pulse is provided on the line 100 during the eighth count of a count cycle of the counter 24. With reference to FIG. 10, information is gated through the gates 135–142 in succession, with information being gated through the gate 135 during a first count cycle, information being gated through the gate 136 during a second count cycle, information being gated through the gate 137 during a third count cycle, etc. Accordingly, when information is being gated through the gate 142 during the eighth count, information is being entered into the flip-flop 117 (see FIG. 9). In addition, when information is being gated through the gate 135 during the first count of the count cycle, information is being entered into the registers 118–124.

The waveforms illustrated in FIGS. 11J, L and M correspond with the waveforms illustrated in FIG. 2. The output of the oscillator 22 is illustrated in FIG. 11K. The serial stream of information on the line 158 in FIG. 10 is illustrated in FIG. 11N.

From a consideration of the waveforms illustrated in FIG. 11, it can be appreciated that the serial stream of information on output lines 158 and 160 is initiated upon the occurrence of a data strobe pulse. The data strobe pulse from output lines 106*a* and 106*b* in FIG. 8 occurs during a first time slot of a counting cycle of the counter 24, while the data strobe pulse on the output line 100 occurs in the previous time slot of the counting cycle. Accordingly, information is entered during a first time slot of the counting cycle into gates 109–115 and information is transferred to the output lines 158 and 160 from the gate 135 during the same time slot of the count cycle. During the next six time slots of the counting cycle, information is transferred from the registers 109–114 through respective ones of the gates 136–141 in sequence to the output lines 158 and 160. During the eighth time slot of the count cycle, information is transferred into the flip-flop 117 through the gates 108 and is transferred onto the output lines 158 and 160 through the gate 142. Any change in the count frequency due to a variation in drum speed will be corrected by the phase locked loop including the oscillator 22, the counter 24, the clock 28, the flip-flop 30, and the filter 32.

The principles of the invention explained in connection with the specific exemplification thereof will suggest many other applications and modifications of the same. It is accordingly desired that, in construing the breadth of the appended claims they shall not be limited to the specific details shown and described in connection with the exemplification thereof.

The invention claimed is:

1. A parallel to serial converter disposed for receiving information in parallel format which is made available at a first rate susceptible of variation, comprising a. a register disposed for receiving the information in parallel format therein, b. a plurality of transfer gates each having an input connected to a respective output of said register, c. means for generating gating pulses at a predetermined rate and supplying said pulses to said transfer gates to transfer the information from parallel form in said register into serial form, d. means for developing an error signal in accordance with the difference between said first rate and said predetermined rate, said generating means being responsive to said error signal for altering the predetermined rate, and e. said generating means including an oscillator, said information including timing pulses having a rate equal to said first rate, said developing means being responsive to an output of said oscillator and to said timing pulses for controlling the frequency of said oscillator.

2. A parallel to serial converter as defined in claim 1, wherein said developing means generates a signal which is proportional to the phase disparity between an output pulse of said oscillator and one of said timing pulses.

3. A parallel to serial converter as defined in claim 2, wherein said developing means includes a bistable device having one input coupled to an output of said oscillator and another input connected to receive said timing pulses, and means for generating a DC voltage proportional in amplitude to the average voltage of an output signal of said bistable device.

4. A parallel to serial converter disposed for receiving information in parallel format which is made available at a first rate susceptible of variation, comprising a. a register disposed for receiving the information in parallel format therein, b. a plurality of transfer gates each having an input connected to a respective output of said register, c. means for generating gating pulses at a predetermined rate and supplying said pulses to said transfer gates to transfer the information from parallel form in said register into serial form, d. means for developing an error signal in accordance with the difference between said first rate and said predetermined rate, said generating means being responsive to said error signal for altering the predetermined rate, and e. said generating means including an oscillator, means for frequency dividing an output of said oscillator for generating said gating signals, said developing means including a bistable device having one input connected to an output of said dividing means, said information including timing pulses having a rate equal to said first rate and being connected to another input of said bistable device, and means for generating a DC voltage proportional in amplitude to the average voltage of an output signal of said bistable device.

5. A parallel to serial converter as defined in claim 4, wherein said oscillator includes a flip-flop and an output connected to one input of said flip-flop, and a second gate having one input connected to another output of said flip-flop and an output connected to another input of said flip-flop, the other input of each of said gates being connected to a source of voltage.

* * * * *